United States Patent
Park

(10) Patent No.: US 6,897,145 B2
(45) Date of Patent: May 24, 2005

(54) METHOD FOR FABRICATING SEMICONDUCTOR DEVICE BY FORMING DAMASCENE INTERCONNECTIONS

(75) Inventor: Je-Min Park, Kyungki-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 69 days.

(21) Appl. No.: 10/627,895

(22) Filed: Jul. 24, 2003

(65) Prior Publication Data

US 2004/0029324 A1 Feb. 12, 2004

(30) Foreign Application Priority Data

Aug. 12, 2002 (KR) .............................. 10-2002-0047588

(51) Int. Cl.[7] ................ H01L 21/8242; H01L 21/4763; H01L 21/44
(52) U.S. Cl. .................... 438/637; 438/250; 438/253; 438/396; 438/618; 438/620; 438/621; 438/622; 438/638; 438/640; 438/672; 438/675
(58) Field of Search ............................... 438/250, 253, 438/618–622, 638, 640, 672, 675

(56) References Cited

U.S. PATENT DOCUMENTS 6,168,992 B1 * 1/2001 Lee ............................ 438/256
6,337,267 B1 * 1/2002 Yang ........................... 438/618
6,528,368 B1 * 3/2003 Park ........................... 438/253

* cited by examiner

Primary Examiner—Craig A. Thompson
Assistant Examiner—David L. Hogans
(74) Attorney, Agent, or Firm—Marger Johnson & McCollom, P.C.

(57) ABSTRACT

A method for fabricating a semiconductor device, in which a sufficient misalignment margin is obtained when forming interconnections and contact holes, is provided. Dielectric layer patterns which define recesses in which damascene interconnections are to be formed, are formed. Then, first contact holes between the dielectric layer patterns are etched, and the first contact holes and the recesses are concurrently filled with a conductive material. The recesses can be filled with the conductive material by performing an etch-back process. The dielectric layer patterns are then etched, thereby forming the damascene interconnections and concurrently covering only a region in which second contact holes are to be formed with the dielectric layer patterns. Spaces between the dielectric layer patterns are filled with a mask layer, and then the dielectric layer patterns are selectively removed from the resultant structure, thereby forming the second contact holes aligned with the damascene interconnections.

9 Claims, 18 Drawing Sheets

METHOD FOR FABRICATING
SEMICONDUCTOR DEVICE BY FORMING
DAMASCENE INTERCONNECTIONS

BACKGROUND OF THE INVENTION

This application claims priority from Korean Patent Application No. 2002-47588, filed on Aug. 12, 2002, the disclosure of which is incorporated herein by reference in its entirety.

1. Field of the Invention

The present invention relates to methods for fabricating semiconductor devices, and more particularly, to methods for fabricating semiconductor devices having damascene interconnections.

2. Description of the Related Art

A conventional photolithography process is commonly used to form desired patterns in semiconductor fabricating processes. As the design rules decrease, however, alignment margins in the photolithography process also are reduced. Thus, it becomes increasingly difficult to form desired patterns, using the conventional photolithography process.

Such difficulty arises even when a bit line of a semiconductor device, such as a dynamic random access memory (DRAM), is formed. For example, if the width of a bit line is 100 nm and the misalignment margin is 40 nm, the width of a storage node contact hole is required to be 40 nm. This is beyond the limits of the conventional exposure equipment, and thus a storage node contact hole having a width of 40 nm cannot be formed. If the width of the storage node contact hole is increased to avoid this problem, unfortunately, a reduction in the misalignment margin occurs corresponding to the increased size of the storage node contact hole. Thus, a short circuit may occur between a storage node contact plug and the bit line.

Accordingly, when forming the bit line and the storage node contact hole, further, when forming a certain interconnection and a contact hole passing beside the interconnection, it is important that the limits of the photolithography process be overcome to obtain an adequate misalignment margin.

SUMMARY OF THE INVENTION

The present invention provides a method for fabricating a semiconductor device, in which a sufficient misalignment margin can be obtained when forming certain interconnections and contact holes.

The present invention also provides a method for fabricating a semiconductor device, in which a sufficient misalignment margin can be obtained when forming bit lines of a DRAM and storage node contact holes.

According to an embodiment of the present invention, a lower dielectric layer and an upper dielectric layer are sequentially stacked on a semiconductor substrate. Dielectric layer patterns to form parallel damascene interconnections on the lower dielectric layer are formed by etching the upper dielectric layer so that each of the dielectric layer patterns has a first width. Next, first contact holes are formed by partially etching the lower dielectric layer between the dielectric layer patterns, and upper parts of sidewalls of the dielectric layer patterns on both sides of the first contact holes are etched so that the dielectric layer patterns have portions having a second width narrower than the first width. First contact plugs are formed by filling the first contact holes with a first conductive material, damascene interconnections are formed on the first contact plugs by filling lower parts of spaces between the dielectric layer patterns with the first conductive material, and the dielectric layer patterns on the damascene interconnections are etched so that only the portions of the dielectric layer patterns having the first width protrude above the damascene interconnections. Subsequently, the damascene interconnections are covered with a mask layer, and the mask layer is planarized until the top surfaces of the dielectric layer patterns remaining after the previous step are exposed. Second contact holes aligned with the damascene interconnections, are formed by selectively removing the remaining dielectric layer patterns and the lower dielectric layer under the remaining dielectric layer patterns with respect to the mask layer. Second contact plugs are formed by filling the second contact holes with a second conductive material.

According to the above method, the second contact holes can be formed without performing the photolithography process, and thus the second contact holes can be precisely aligned without needing to consider a process margin.

According to another embodiment of the present invention, there is provided a method for fabricating a semiconductor device. In the above method, as a method for obtaining positions where storage node contact holes are to be formed while forming bit lines using damascene methods, the storage node contact holes are formed without performing a photolithography process. Gate stacks comprising a gate dielectric layer, a gate conductive layer, a capping layer, and a gate spacer, and source and drain regions are formed on a semiconductor substrate. A first oxide layer filling spaces between the gate stacks is covered, and the first oxide layer is planarized. First cell pads connected to the source regions and second cell pads connected to the drain regions are formed in the first oxide layer. A second oxide layer is formed on the first oxide layer and the first and second cell pads. An etch stopper and a third oxide layer are sequentially stacked on the second oxide layer. Oxide layer patterns to form damascene bit lines parallel to each other on the second oxide layer are formed by etching the third oxide layer. Here, each of the oxide layer patterns has a first width. Next, bit line contact holes through which the top surfaces of the second cell pads are exposed, are formed by partially etching the etch stopper between the oxide layer patterns and the second oxide layer, and concurrently, upper parts of sidewalls of the oxide layer patterns on both sides of the bit line contact holes are etched so that the oxide layer patterns have portions having a second width narrower than the first width. Bit line contact plugs are formed by filling the bit line contact holes with a first conductive material, forming damascene bit lines on the bit line contact plugs by filling lower parts of spaces between the oxide layer patterns with the first conductive material, and the oxide layer patterns over the bit lines are etched so that only the portions of the oxide layer patterns having the first width protrude above the bit lines. The bit lines are covered with a mask layer, and the mask layer is planarized until the top surfaces of the oxide layer patterns remaining after the previous step exposed. Storage node contact holes aligned with the bit lines where the remaining oxide layer patterns are placed, are formed by selectively removing the remaining oxide layer patterns, the etch stopper under the remaining oxide layer patterns, and the second oxide layer with respect to the mask layer. Storage node contact plugs are formed by filling the storage node contact holes with a second conductive material.

Here, it is preferable that the mask layer be formed of a material having a different etch selectivity from those of the third oxide layer and the second oxide layer. Preferably, the mask layer is formed of a nitride layer or an oxynitride layer, for example.

Planarizing the mask layer is performed using an etchback or a chemical mechanical polishing (CMP) process. The thickness of the third oxide layer is about 500 to about 6000 Å, and the thickness of the etch stopper is about 10 to about 500 Å.

According to the above method, the bit lines are formed using a damascene method, a region in which the storage node contact holes are to be formed is obtained in advance without a misalignment, and then the storage node contact holes are formed self-aligned with the bit lines in the region. The storage node contact holes can be precisely aligned at desired positions and precisely formed, compared to a case where the storage node contact holes are formed using a photolithography process after the bit lines are formed. Thus, the semiconductor device can be fabricated without concerning a short circuit occurring between the bit lines and storage node contact plugs.

BRIEF DESCRIPTION OF THE DRAWINGS

The above and the other aspects and advantages of the present invention will become more apparent by describing in detail preferred embodiments thereof with reference to the attached drawings, in which.

DETAILED DESCRIPTION OF THE INVENTION

Figure 1:
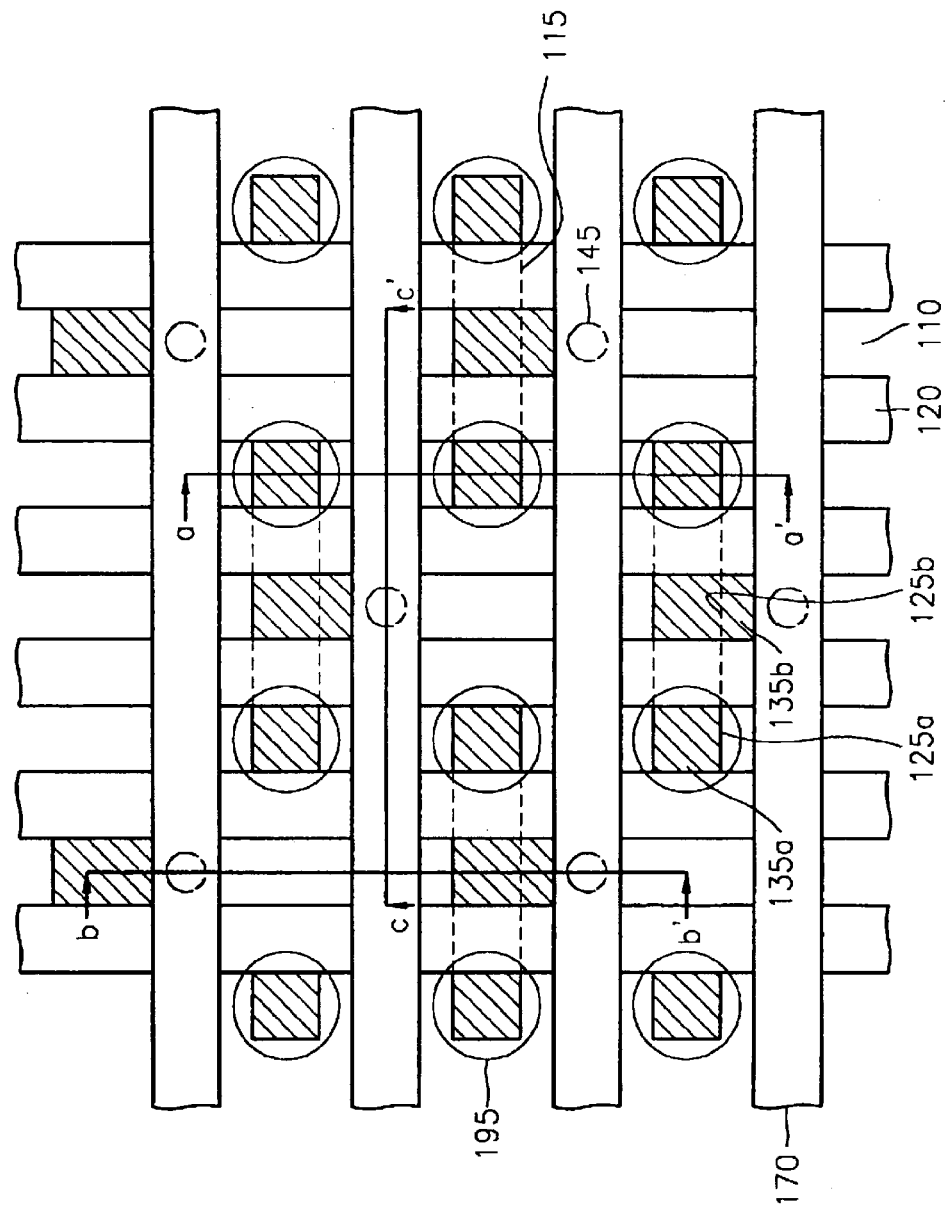
FIG. 1 shows the layout of a DRAM cell to be realized in an embodiment of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the scope of the invention to those skilled in the art. In the drawings, the forms of elements are exaggerated for clarity. Like reference numerals refer to like elements throughout the drawings.

The present embodiment illustrates the formation of bit lines of a DRAM using a damascene method, and storage node contact holes. FIG. 1 shows the layout of a DRAM cell.

Figure 2A:
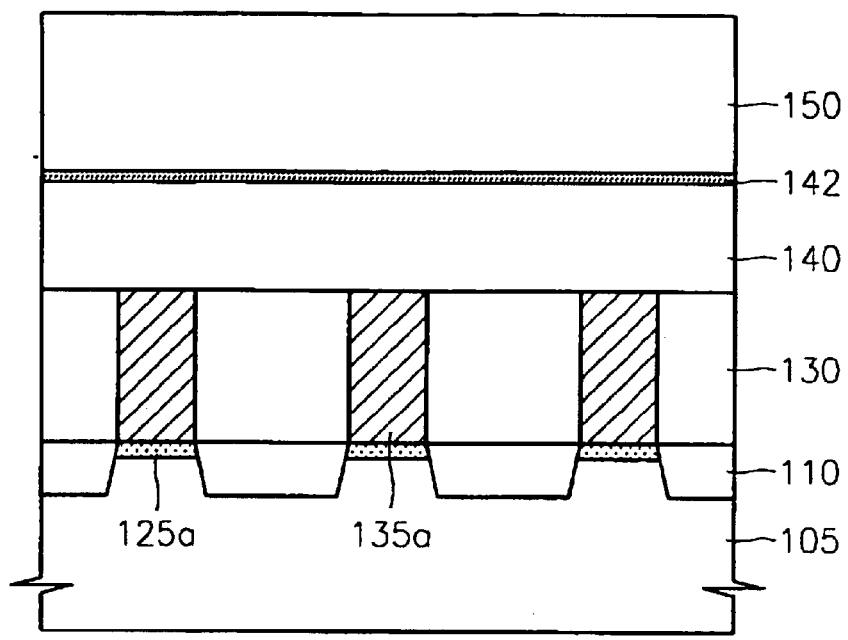
FIGS. 2A, 3A, 4A, 5A, 6A, 7A, and 8A are cross-sectional views sequentially illustrating an embodiment of a method for fabricating a semiconductor device according to an embodiment of the present invention, taken along line a–a' of FIG. 1.

FIG. 1 shows the layout of a DRAM cell. In particular, an isolation layer 110 formed of an insulating material is formed in a semiconductor substrate 105 (FIG. 2A). The isolation layer 110 defines active regions 115 having major and minor axes that are repeatedly arranged along rows and columns. Gate stacks 120 extending along a minor axis of the active regions 115 intersect the active regions 115, and two gate stacks 120 intersect each of the active regions 115. Source and drain regions 125a and 125b are formed in the active regions 115 on either side of the gate stacks 120. A contact region implemented by cell pads 135a and 135b is provided in the source and drain regions 125a and 125b. Bit line contact plugs 145 are formed on the cell pads 135b contacting the drain regions 125b, and bit lines 170 are arranged on the bit line contact plugs 145 perpendicular to the direction in which the gate stacks 120 extend. Another contact region implemented by a storage node contact plug 195 is provided on the cell pads 135a contacting the source regions 125a.

Figure 2B:
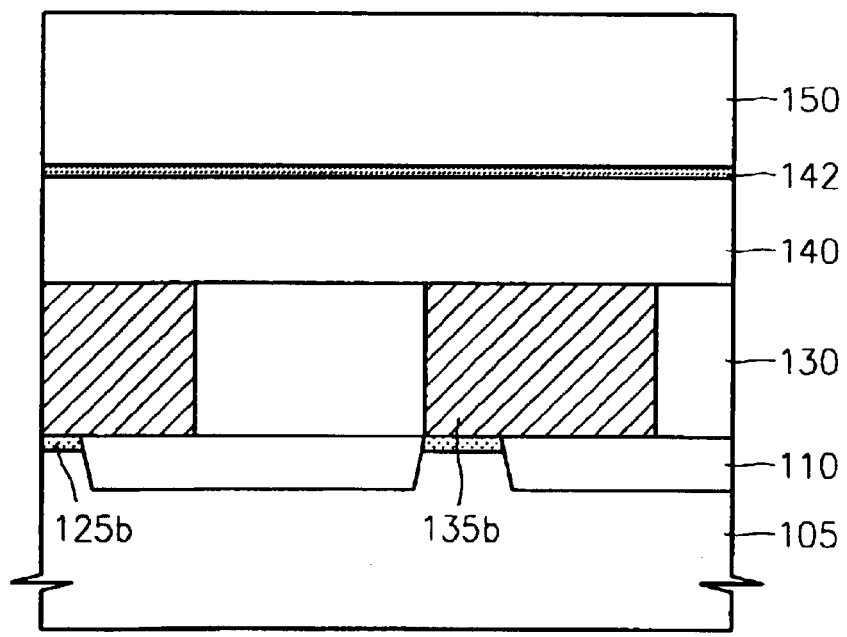
FIGS. 2B, 3B, 4B, 5B, and 6B are cross-sectional views sequentially illustrating the method for fabricating a semiconductor device according to an embodiment of the present invention, taken along line b–b' of FIG. 1.
Figure 2C:
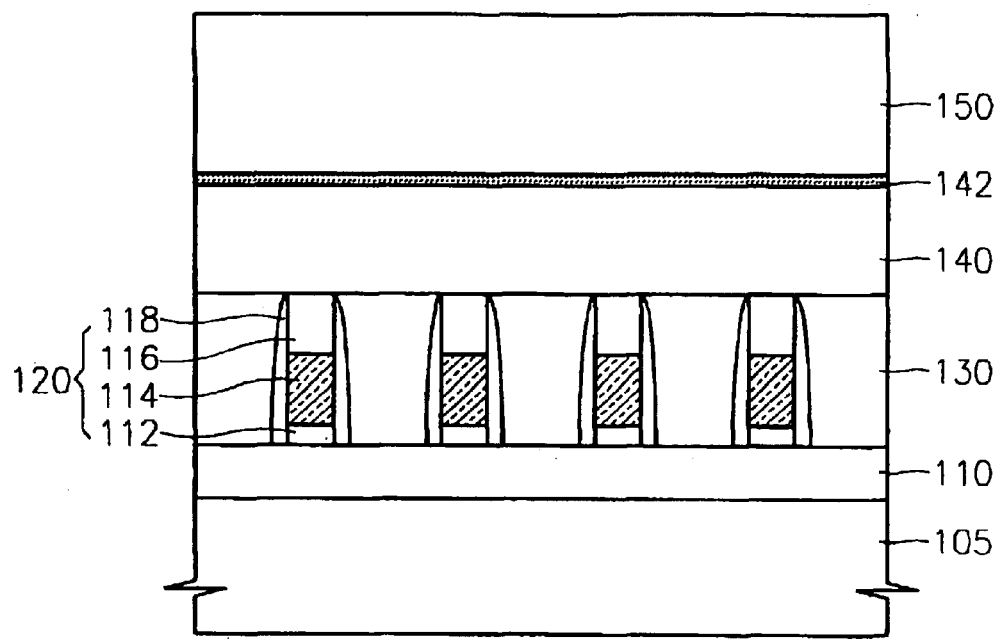
FIGS. 2C, 3C, 4C, 5C, and 6C are cross-sectional views sequentially illustrating the embodiment of the method for fabricating a semiconductor device according to an embodiment of the present invention, taken along line c–c' of FIG. 1.

Referring to FIGS. 2A through 2C, the isolation layer 110 for defining the active regions 115 shown in FIG. 1 is formed in the substrate 105, such as a silicon wafer, using conventional isolation techniques such as shallow trench isolation (STI). The gate stacks 120 and the source and drain regions 125a and 125b are formed on the substrate 105 including the isolation layer 110.

As shown in FIG. 2C, a gate dielectric layer 112, a gate conductive layer 114, and a capping layer 116 are formed and patterned, and then a gate spacer 118 is formed on sidewalls thereof to form the gate stacks 120. The gate conductive layer 114 may be a polycide structure in which silicide is formed on polysilicon. The capping layer 116 and the gate spacer 118 may be formed of nitride. Next, impurities are ion-implanted in the substrate 105 on both sides of the gate stacks 120, thereby forming the source and drain regions 125a and 125b. The source and drain regions 125a and 125b may be formed to have a lightly doped drain (LDD) structure.

Figure 3A:
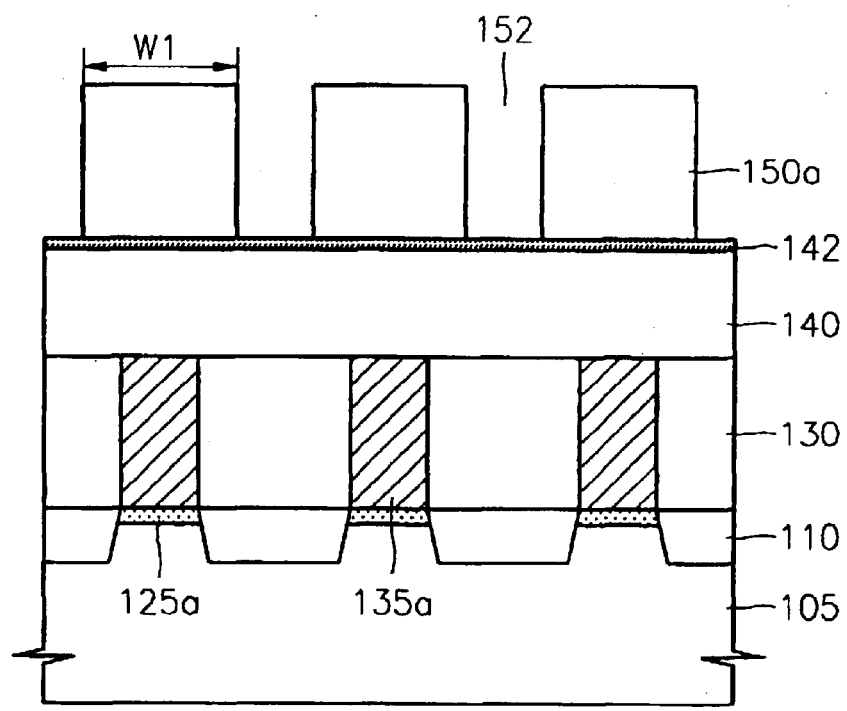
Figure 3B:
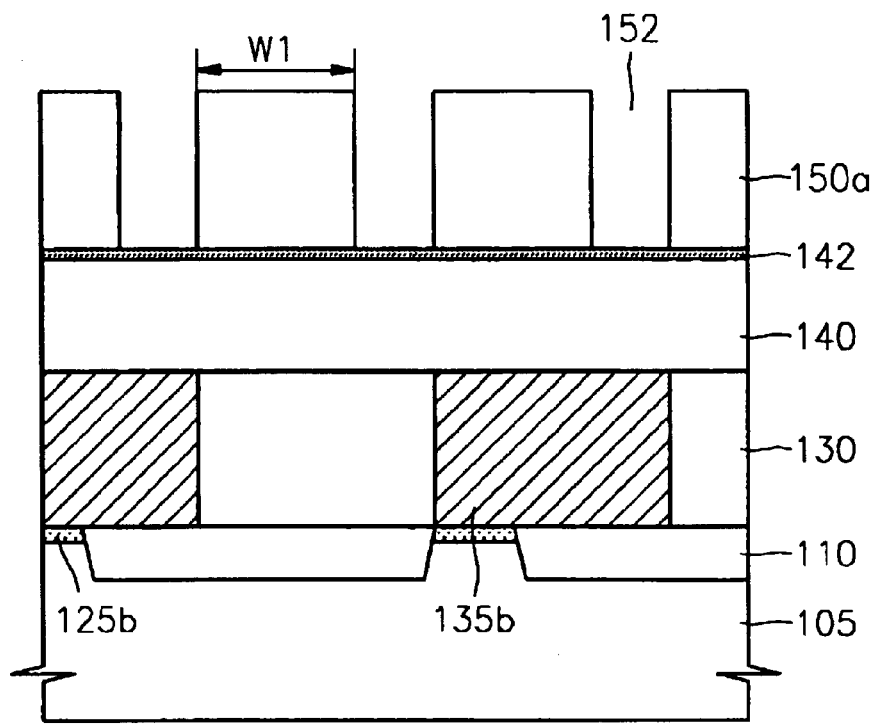
Figure 3C:
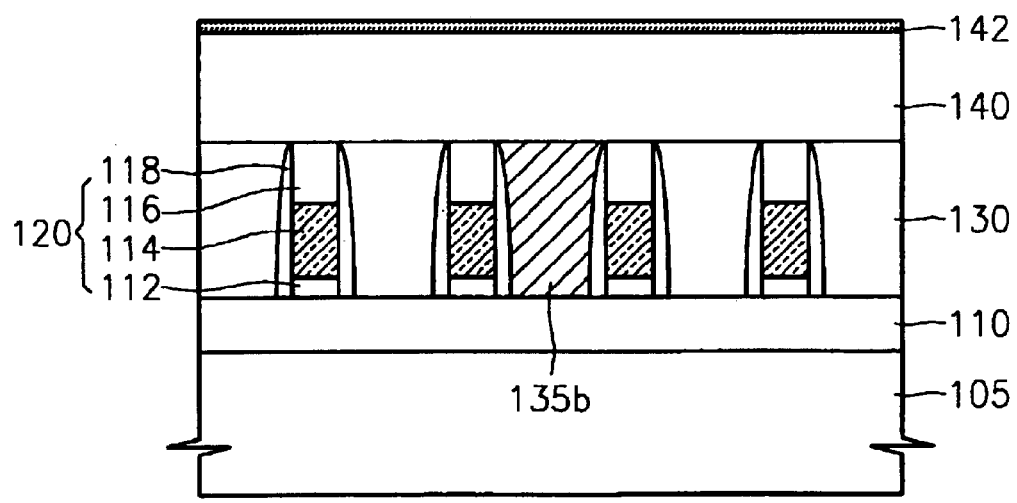
Figure 3D:
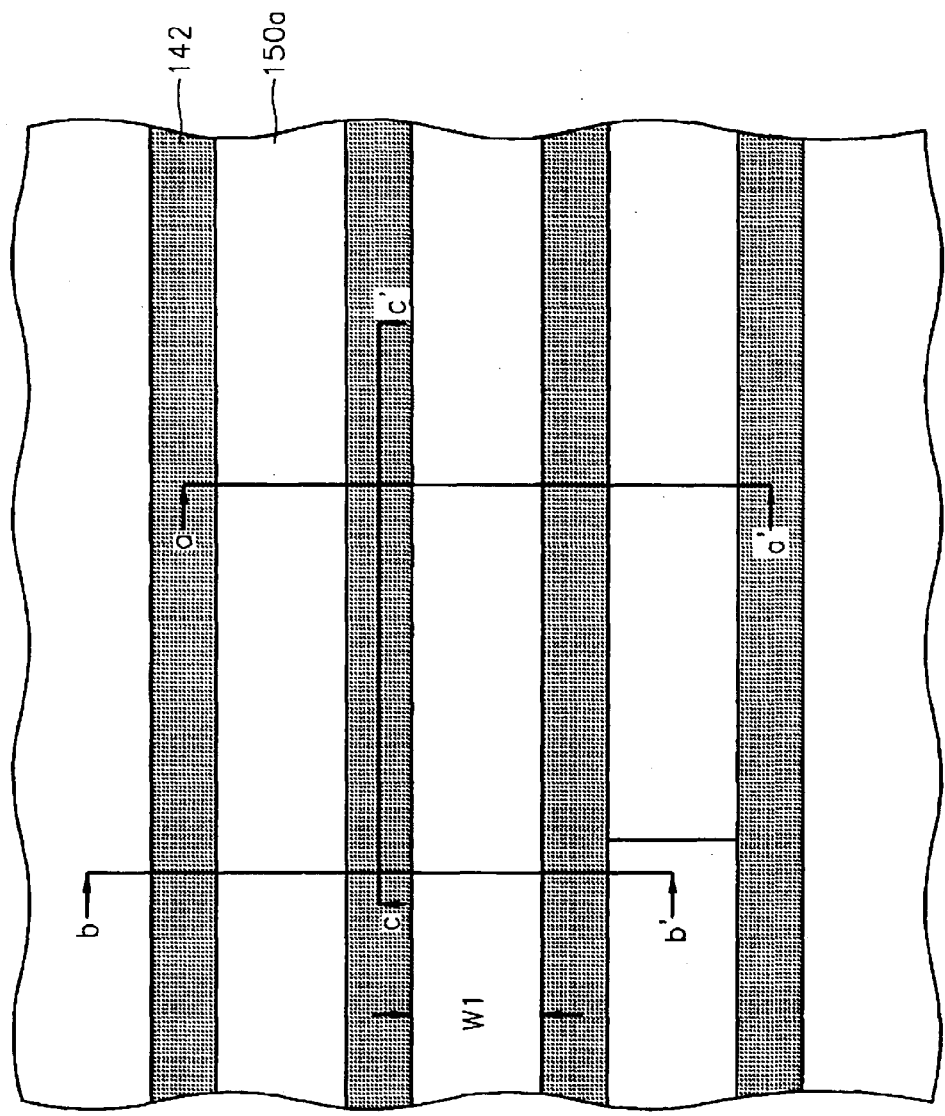
FIG. 3D is a top side view corresponding to FIGS. 3A through 3C.

Subsequently, a first oxide layer 130 is formed to fill the spaces between the gate stacks 120 and planarized using a chemical mechanical polishing (CMP) process in which the capping layer 116 is used as a stopper. Then, a predetermined portion of the first oxide layer 130 is etched until the source and drain regions 125a and 125b are exposed, using an etching gas, such as $C_4F_8$ or $C_5F_8$. In this case, the first oxide layer 130 has an etch selectivity with respect to the capping layer 116 and the gate spacer 118. The gate conductive layer 114 is surrounded by the capping layer 116 and the gate spacer 118, and the first oxide layer 130 has an etch selectivity with respect to the capping layer 116 and the gate spacer 118. Therefore, contact holes (not shown in FIG. 2C) are formed self-aligned with the capping layer 116 and the gate spacer 118. First cell pads 135a connected to the source regions 125a (FIG. 3C) and second cell pads 135b connected to the drain regions 125 are then formed by filling the holes with a conductive layer, such as doped polysilicon.

Subsequently, a second oxide layer 140 is formed on the first oxide layer 130 and on the first and second cell pads 135a and 135b. Then an etch stopper 142 and a third oxide layer 150 are sequentially stacked on the second oxide layer 140. The third oxide layer 150 is formed to a thickness greater than the thickness of the bit lines to be formed, e.g., a thickness of about 500 to about 7000 Å, to form damascene bit lines. A boron phosphorus silicate glass (BPSG) layer, a spin-on glass (SOG) layer, an undoped silicate glass (USG) layer, a silicon oxide layer formed using high-density plasma chemical vapor deposition (HDP CVD), and a tetraethylorthosilicate (TEOS) layer formed using plasma enhanced chemical vapor deposition (PE CVD) may be deposited as the third oxide layer 150.

Referring to FIGS. 3A through 3D, oxide layer patterns 150a to form damascene bit lines parallel with each other are formed on the second oxide layer 140 by etching the third oxide layer 150. Each of the oxide layer patterns 150a is formed to have a first width W1. Damascene bit line recesses 152 are defined between the oxide layer patterns 150a.

Referring to FIGS. 4A through 4D, predetermined portions of the etch stopper 142 and the second oxide layer 140 between the oxide layer patterns 150a are etched to expose the top surface of the second cell pads 135b, thereby forming bit line contact holes 144. Concurrently, upper parts of sidewalls of the oxide layer patterns 150a on both sides of the bit line contact holes 144 are partially etched such that top portions of the oxide layer patterns 150a each have a second width W2 narrower than the first width W1. The bit line contact holes 144 are patterned to be sufficiently overlapped with bit lines 170 (FIG. 5A), which is to be formed by filling the damascene bit line recesses 152. Reference numeral "150b" denotes oxide layer patterns that are modified to have the first width W1 and the second width W2.

Figure 4A:
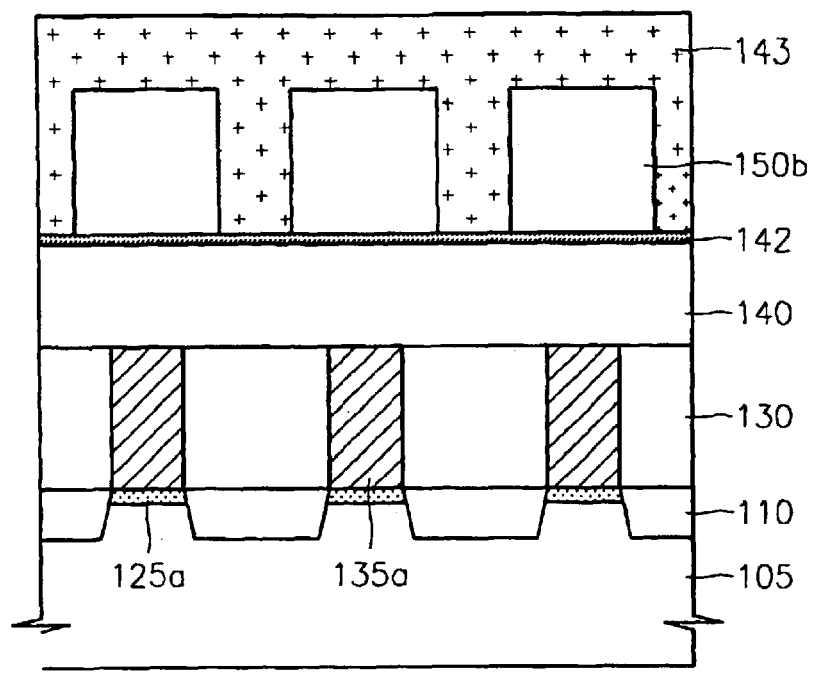
Figure 4B:
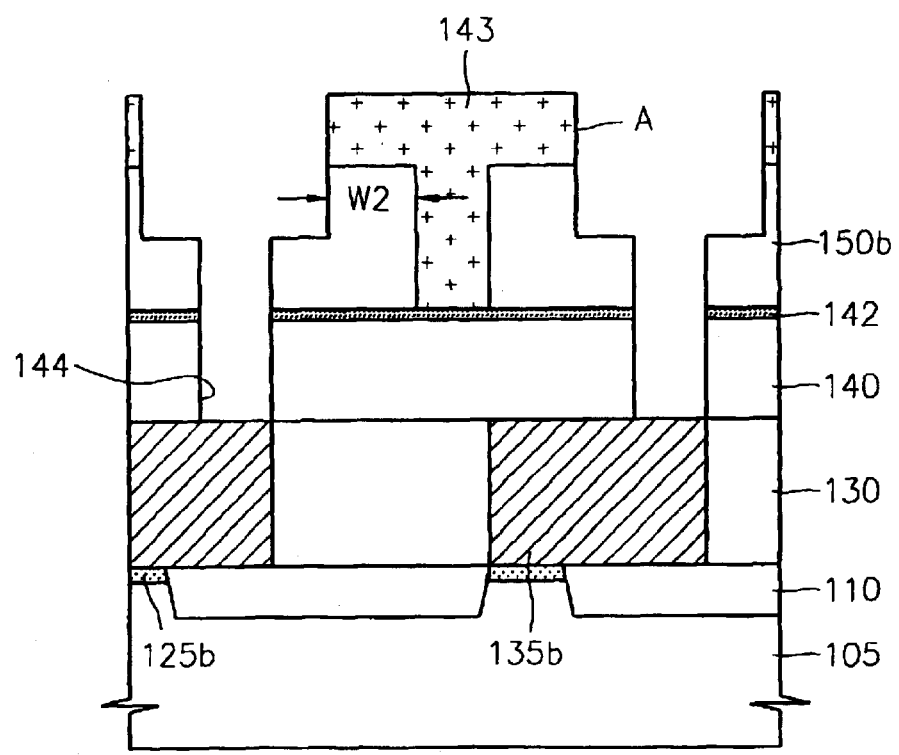
Figure 4C:
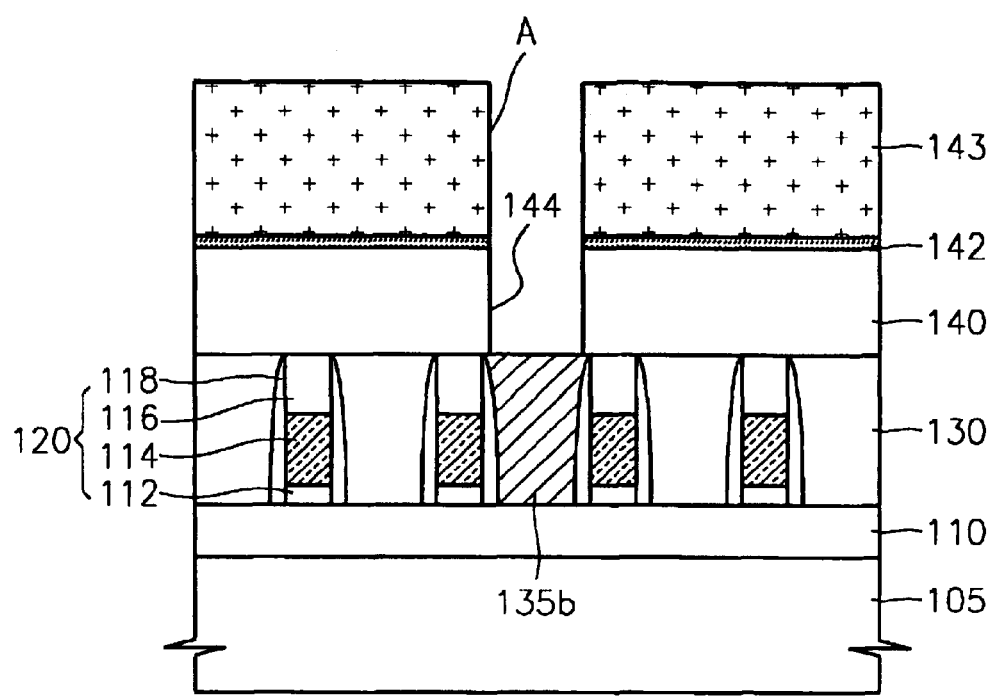
Figure 4D:
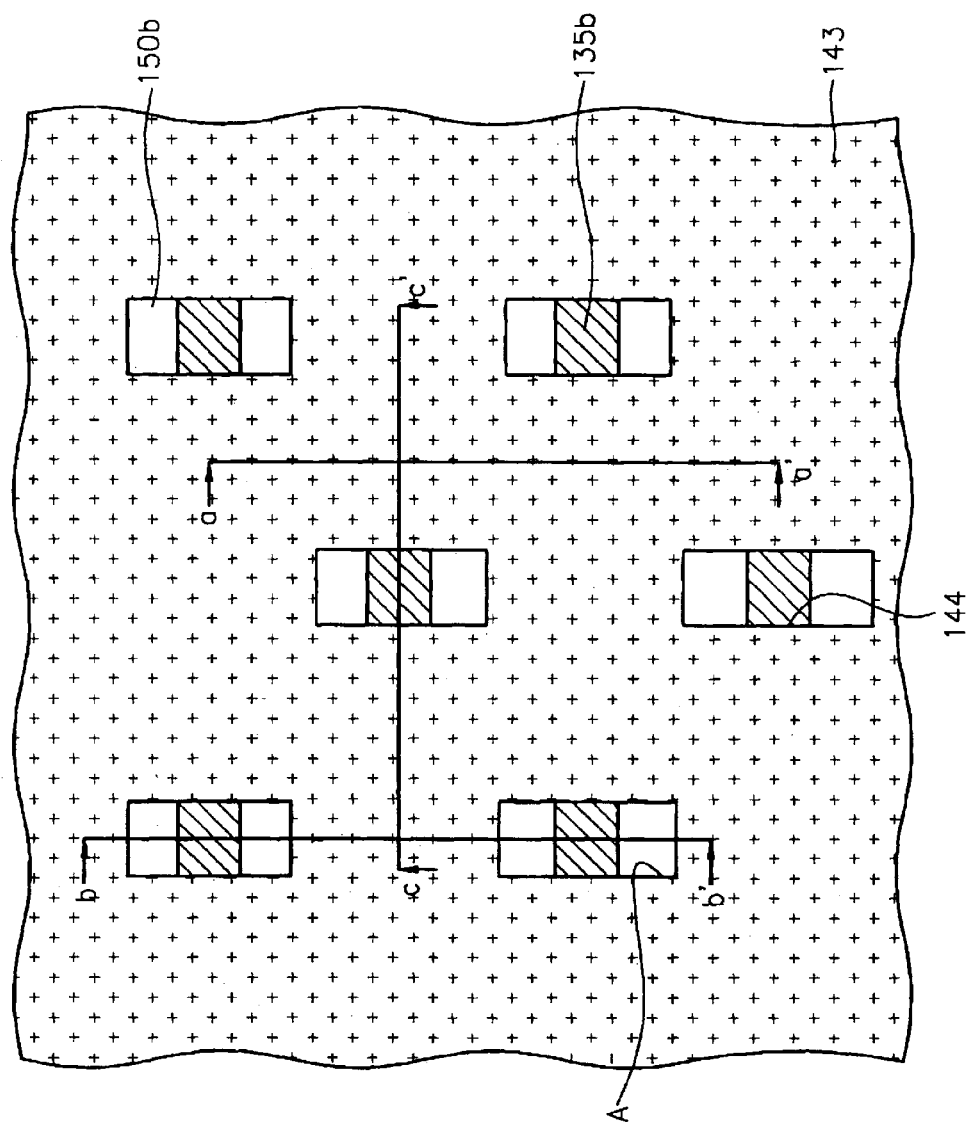
FIG. 4D is a top side view corresponding to FIGS. 4A through 4C.
Figure 5A:
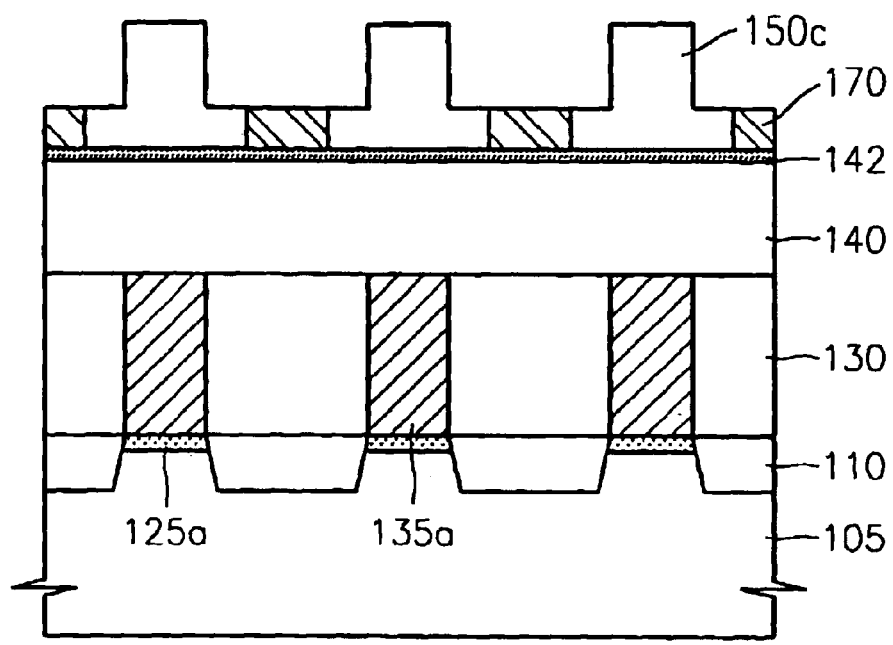
Figure 5B:
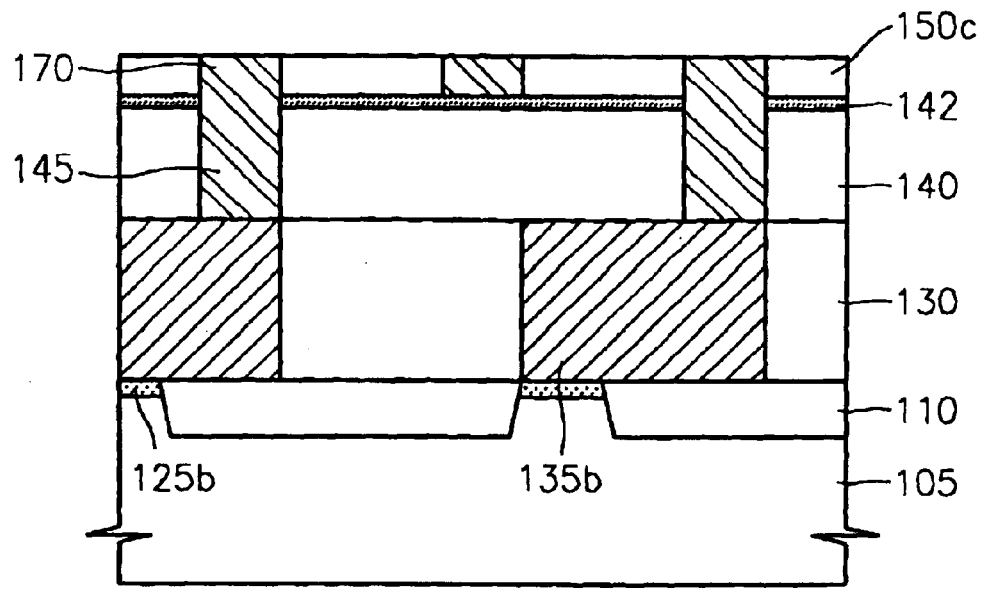
Figure 5C:
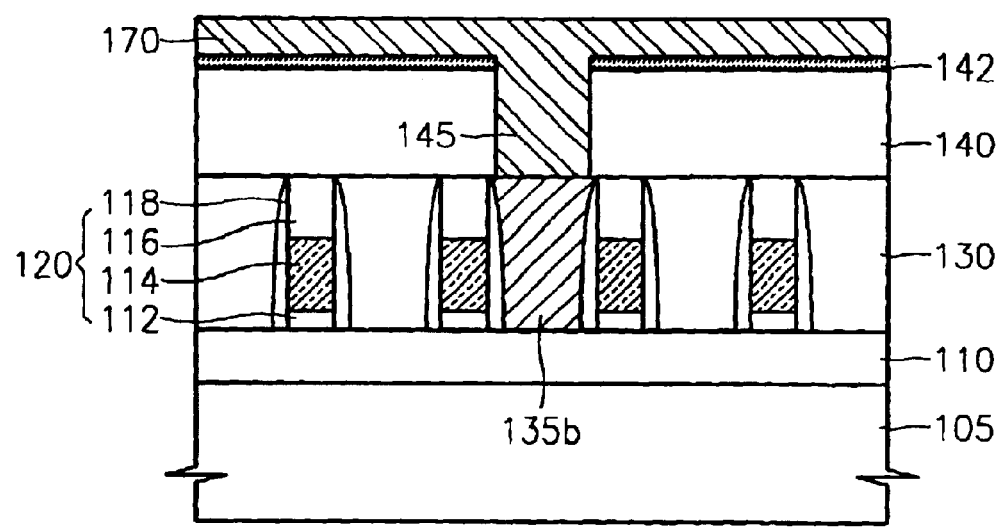
Figure 5D:
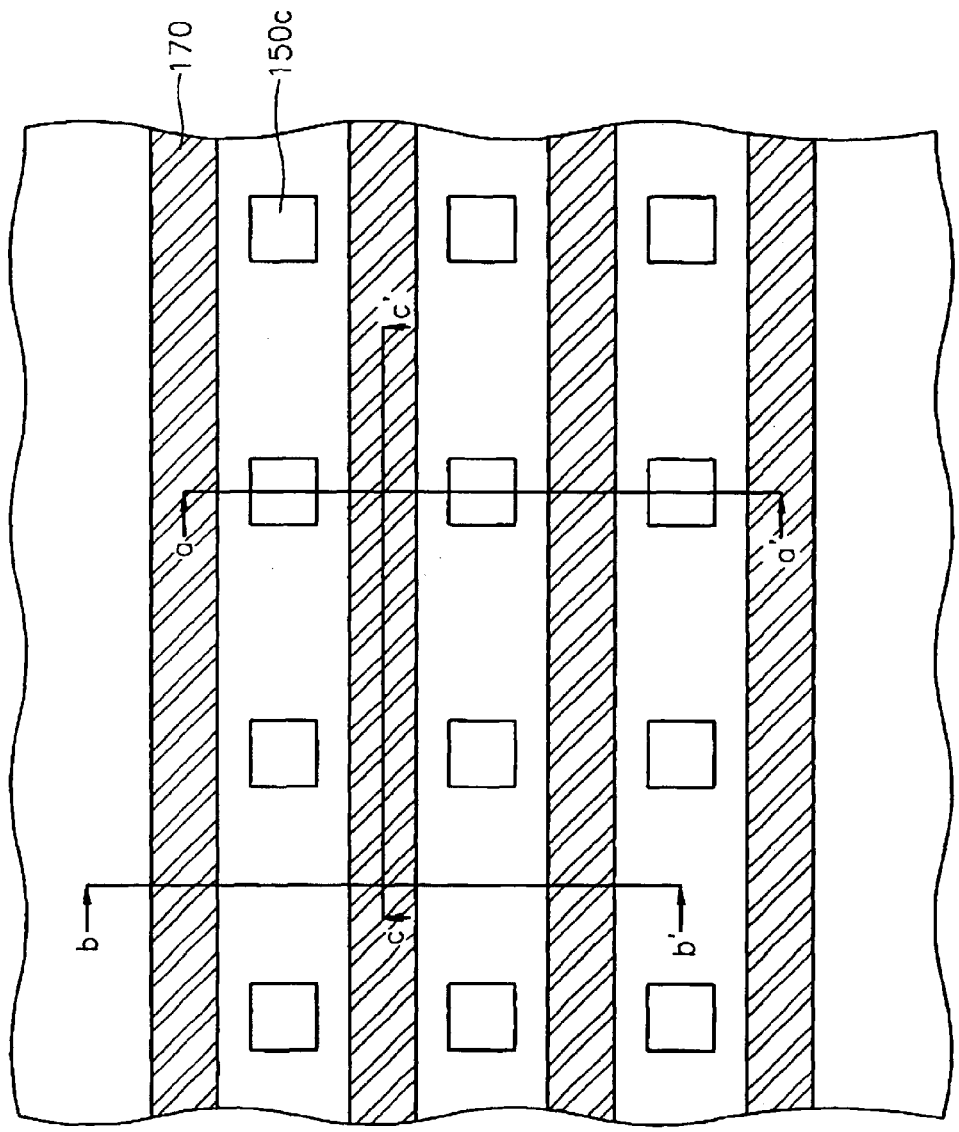
FIG. 5D is a top side view corresponding to FIGS. 5A through 5C.
Figure 6A:
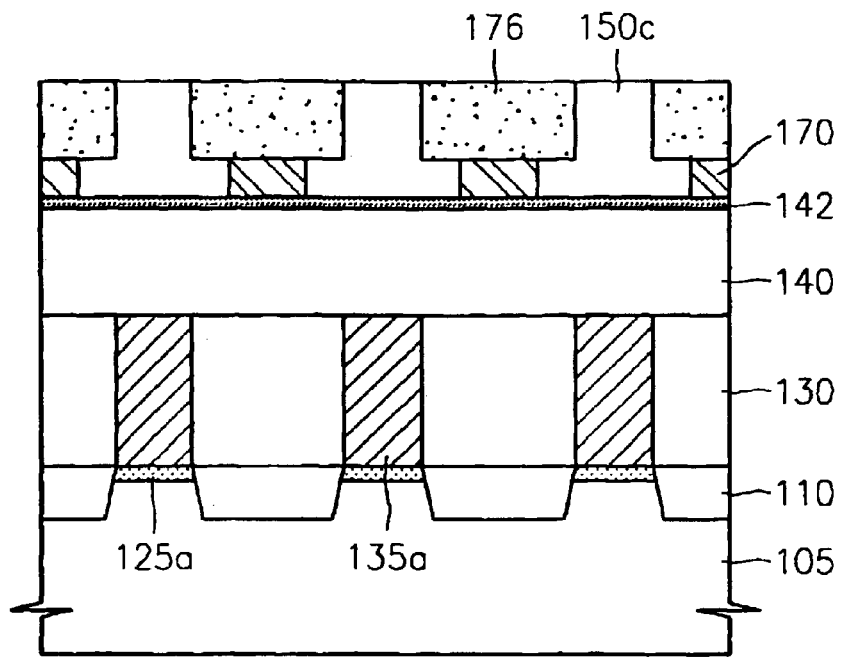
Figure 6B:
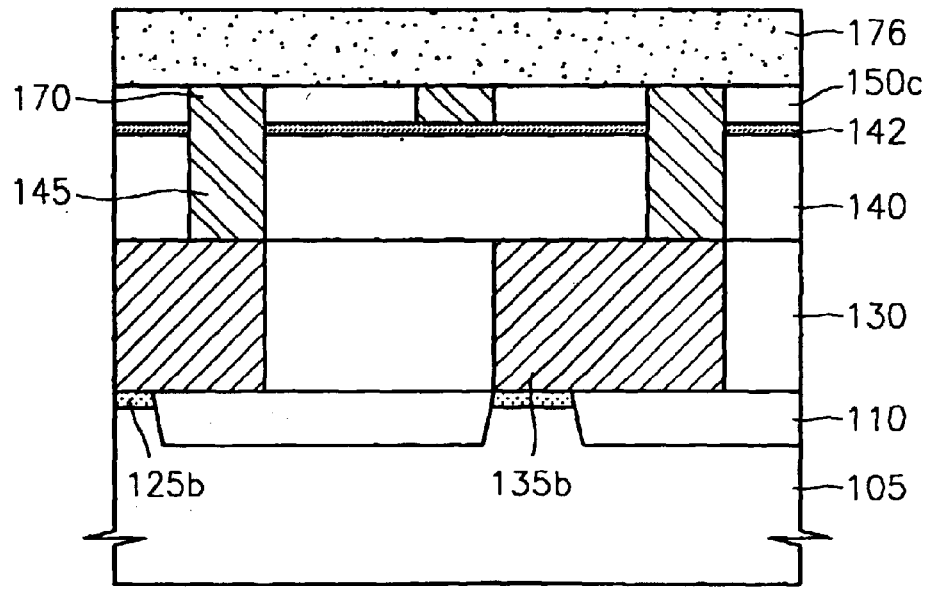
Figure 6C:
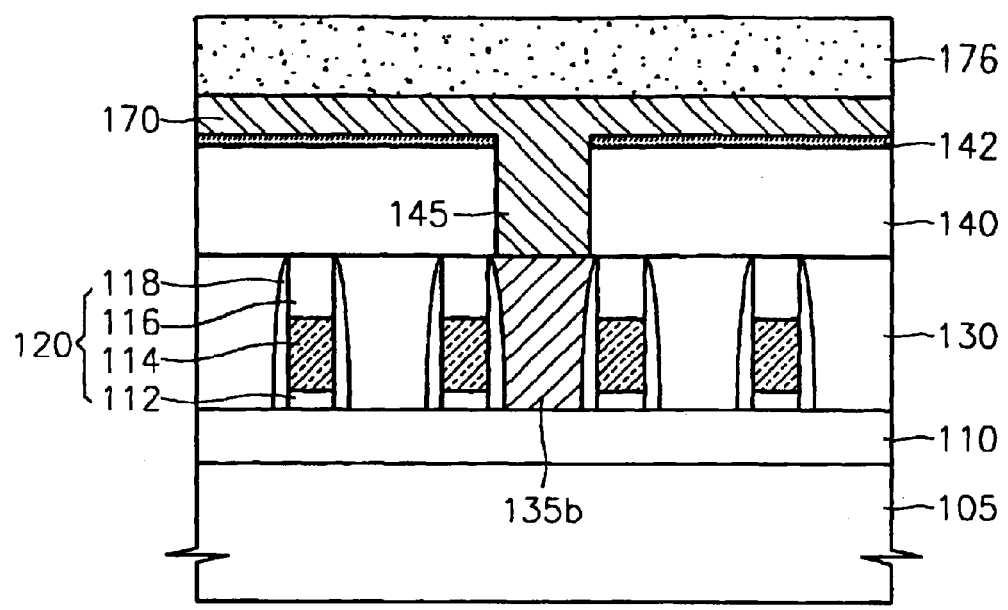
Figure 6D:
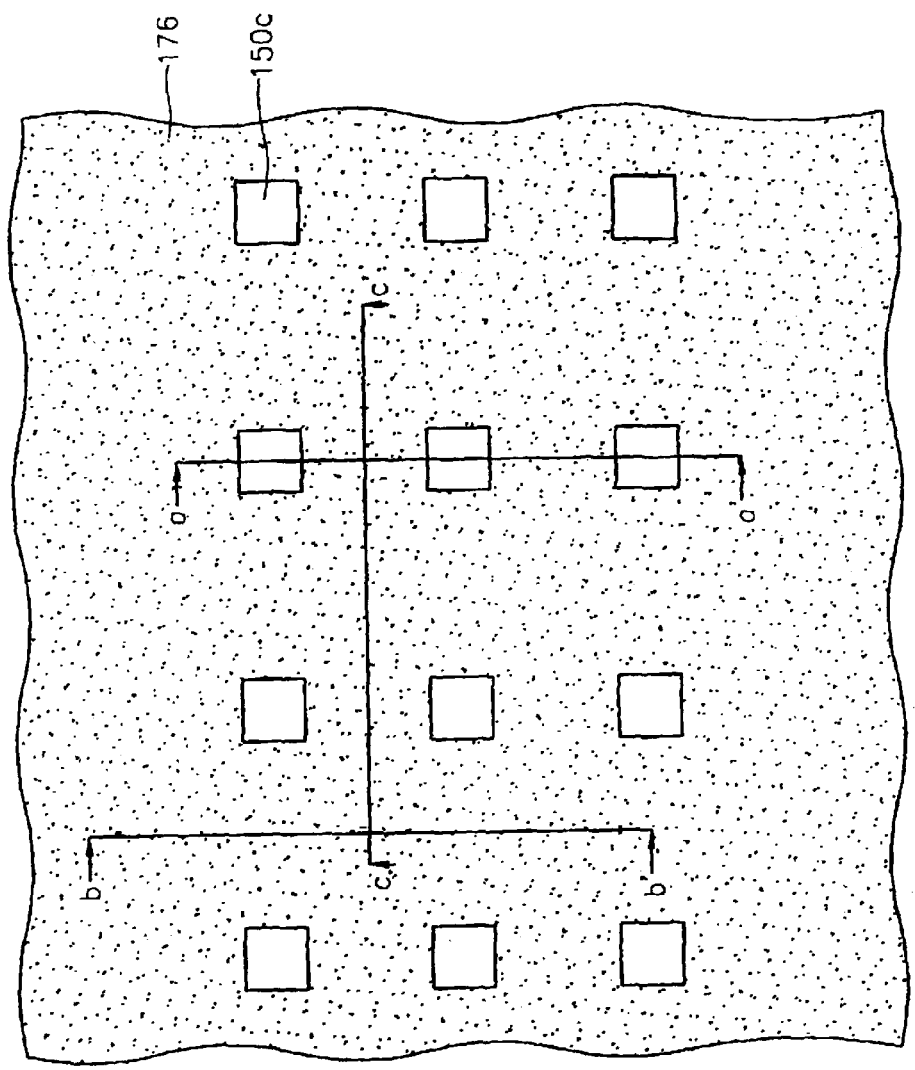
FIG. 6D is a top side view corresponding to FIGS. 6A through 6C.

As shown in FIG. 4D, the oxide layer patterns 150a (exposed by an opening A), the etch stopper 142, and the second oxide layer 140 are etched without an etch selectivity, using a photoresist pattern 143 having the opening A wider than the bit line contact holes 144 to be formed as a mask.

Next, referring to FIGS. 5A through 5D, bit line contact plugs 145 are formed by filling the bit line contact holes 144 with a conductive material. Also, damascene bit lines 170 that are connected to the upper portions of the bit line contact plugs 145 are formed by filling spaces between the oxide layer patterns 150b, that is, in lower parts of the damascene bit line recesses 152 with the conductive material. The oxide layer patterns 150b above the upper portions of bit lines 170 are etched such that only the portions of the oxide layer patterns 150b corresponding to the first width W1 protrude above the bit lines 170. Reference numeral "150c" denotes oxide layer patterns remaining after the above etching step.

Referring to FIGS. 5A through 5D together with FIG. 1, the portions of the remaining oxide layer patterns 150c higher than the bit lines 170 are formed only in positions in which storage node contact holes are to be formed. That is, the portions of oxide layer patterns 150c protrude above the bit lines 170 only in an area where the storage node contact holes are to be formed.

In detail, the bit line contact plugs 145 are formed by filling the bit line contact holes 144 with a conductive material, and concurrently, the spaces between the modified oxide layer patterns 150b are filled by depositing the conductive material. The conductive material may be, for example, doped polysilicon or metal such as tungsten. When the conductive material is metal, a barrier layer (not shown), such as a Ti/TiN layer, is further formed before forming the metal, thereby preventing the diffusion of metal into the vicinity of the bit line contact plugs 145.

Next, an etch-back process is performed on the resultant structure on which the conductive material is deposited, thereby planarizing the conductive material from the top surfaces of the modified oxide layer patterns 150b. That is, the bit lines 170 are formed by filling the conductive material in the bit line damascene recesses 152 and etching back the resulting structure. With this etch-back process, the oxide layer patterns 150b are also etched. As a result, the height of the oxide layer patterns 150b is reduced, and relatively thin portions corresponding to the second width W2 of the oxide layer patterns 150b are removed to form oxide layer patterns 150c. Only the relatively thick portions corresponding to the first width W1 of the oxide layer patterns 150b protrude above the bit lines 170.

In another embodiment, the conductive material is deposited to fill the bit line contact holes 144 and spaces between the modified oxide layer patterns 150b. Then, an etch back process is performed on the resulting structure to recess the conductive material from the oxide layer patterns 150b, thereby forming the bit lines 170. The etch-back process reduces the overall width of the oxide layer patterns 150b protruding above the bit lines 170. Next, the oxide layer patterns having a reduced width are etched using dry etching, wet etching, or plasma etching. As a result, the relatively thin portions corresponding to the second width W2 of the modified oxide layer patterns 150b are etched and removed, and only the portions having the first width W1 protrude above the bit lines 170.

In addition, a bit line spacer may be formed on sidewalls of the oxide layer patterns 150b.

Referring to FIGS. 6A through 6D, the bit lines 170 are covered with a mask layer 176, and the mask layer 176 is planarized until the top surfaces of the remaining oxide layer patterns 150c are exposed. The thickness of the mask layer 176 may be about 100 to about 5000 Å, and the mask layer 176 may be planarized using an etch-back or a CMP process.

Preferably, the mask layer 176 is formed of a material having an etch selectivity with respect to the remaining oxide layer patterns 150c such as nitride or oxynitride.

Figure 7A:
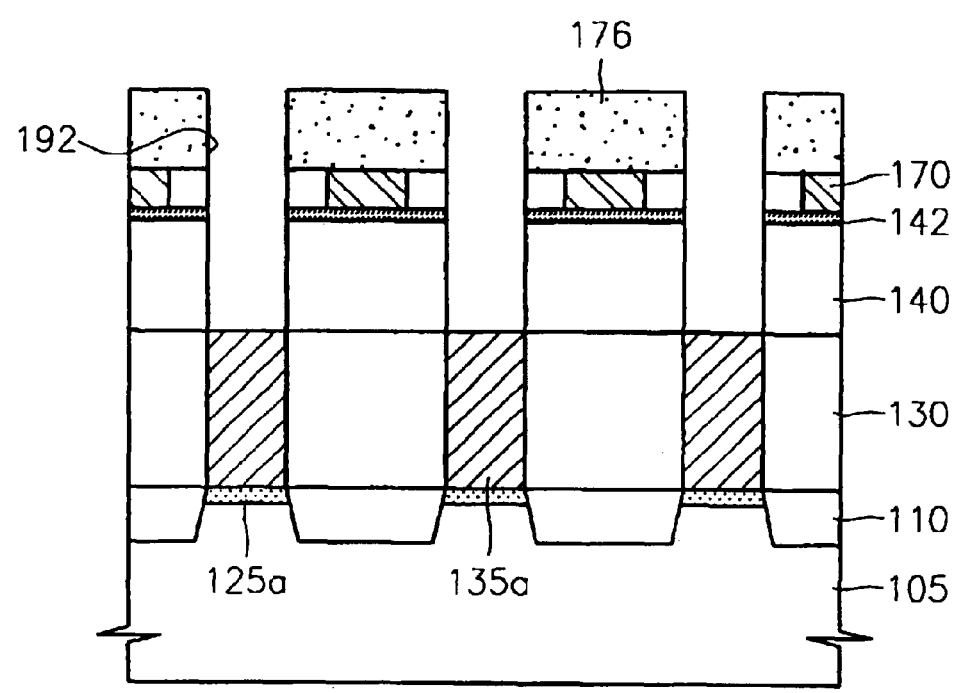
Figure 7B:
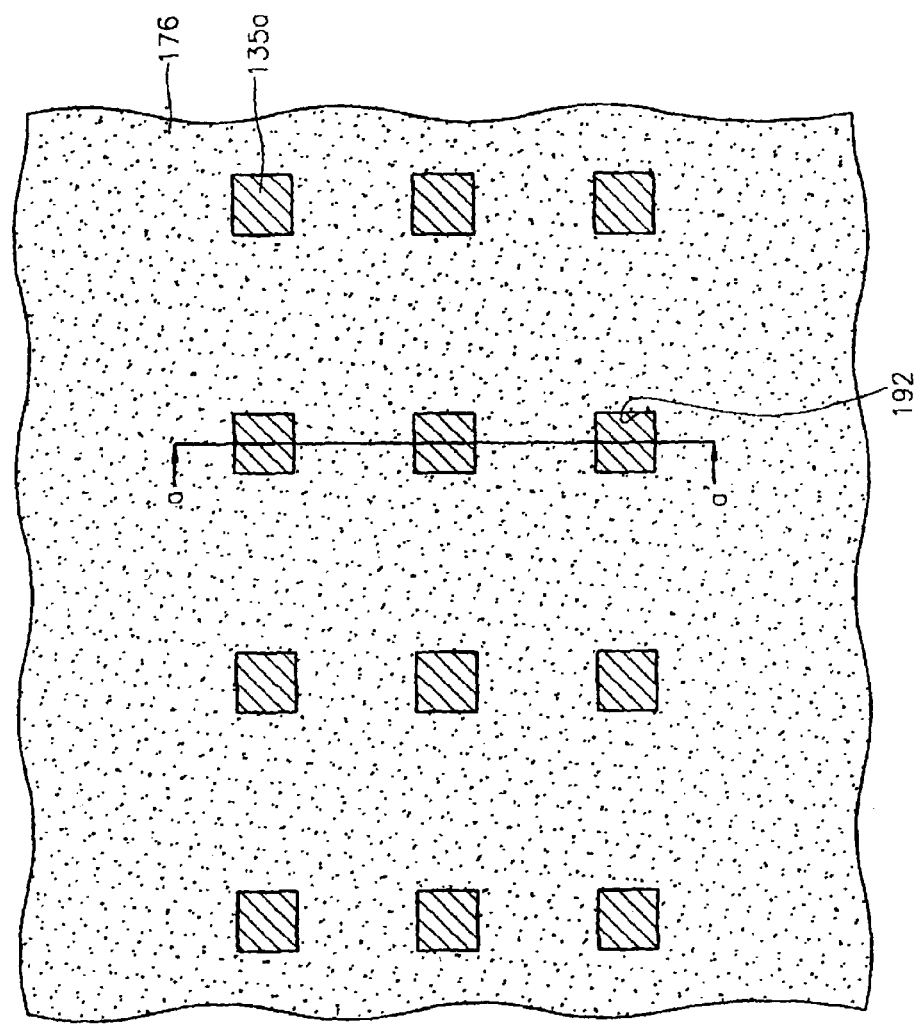
FIG. 7B is a top side view corresponding to FIG. 7A.

Turning to FIGS. 7A and 7B, the remaining oxide layer patterns 150c, the etch stopper 142 under the remaining oxide layer patterns 150c, and the second oxide layer 140 are selectively removed with respect to the mask layer 176, thereby exposing the top surfaces of the first cell pads 135a. As a result, storage node contact holes 192 are formed arranged with the bit lines 170 where the remaining oxide layer patterns 150c are placed.

First, HF or buffered oxide etchant (BOE) is used to selectively remove the remaining oxide layer patterns 150c with respect to the mask layer 176. Here, the HF is diluted with $H_2O$. The diluted HF solution is usually placed at room temperature and the ratio of HF to $H_2O$ is about 1:10 to 1:1000. HF may be applied by using a dip method or spray method. The BOE is formed by mixing HF with $NH_4F$. If the remaining oxide layer patterns 150c are selectively removed, an opening in which the etch stopper 142 is exposed is formed. If dry etching is performed without an etch selectivity against the etch stopper 142 and the second oxide layer 140, the second oxide layer 140 is etched in the shape of the opening, and the top surfaces of the first cell pads 135a are exposed, thereby forming the storage node contact holes 192 precisely aligned with respect to the bit lines 170. Thus, the storage node contact holes 192 can be precisely formed without needing to perform a difficult photolithography process.

Figure 8A:
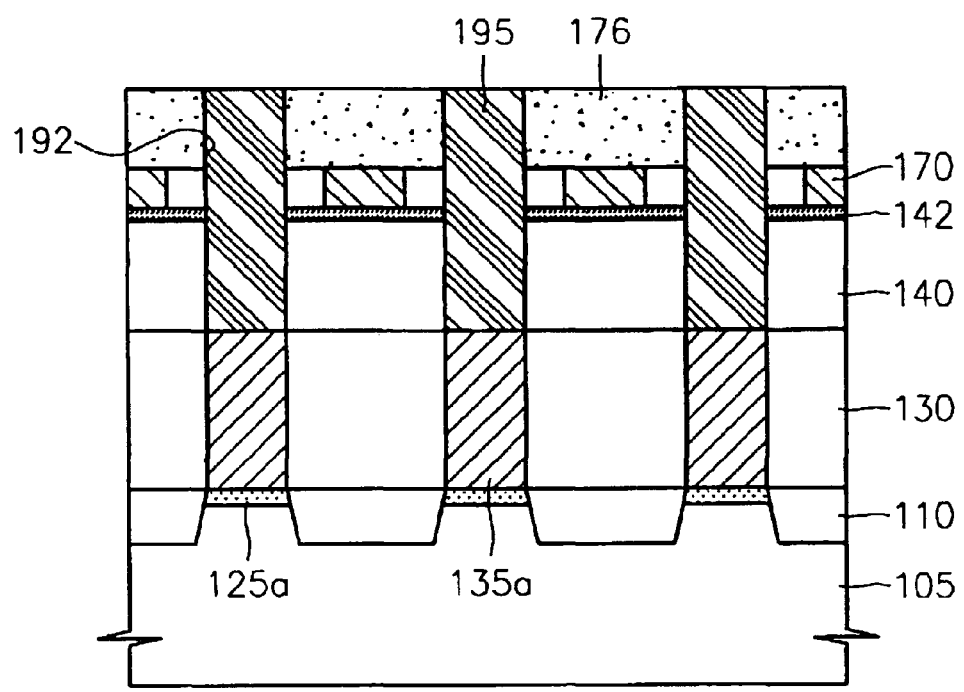
Figure 8B:
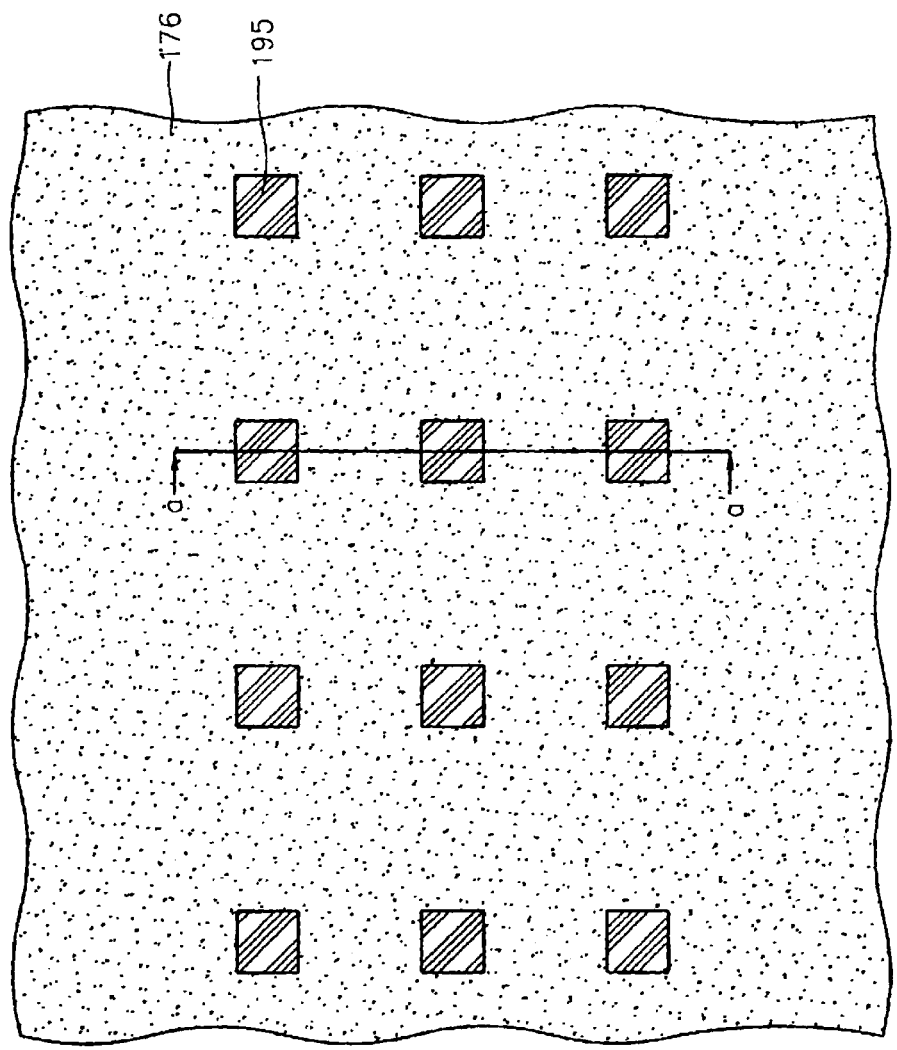
FIG. 8B is a top side view corresponding to FIG. 8A.

Next, a conductive material is deposited thereon to fill the storage node contact holes 192 and then planarized using the mask layer 176 as an end point, thereby forming the storage node contact plugs 195, as shown in FIGS. 8A and 8B. A doped polysilicon layer may be deposited as the conductive material filling the storage node contact holes 192. The storage node contact plugs 195 may be insulated by additionally forming a spacer on inner walls of the storage node contact holes 192 using a dielectric layer, before filling the storage node contact holes 192 with the conductive material.

In summary, according to one embodiment of the present invention, the oxide layer patterns which define recesses in which the damascene bit lines are to be filled are formed. Then, the bit line contact holes are etched between the oxide layer patterns, and the bit lines contact holes and the recesses are concurrently filled with a conductive material. The recesses can be filled with the conductive material with an etch-back process. The oxide layer patterns are then etched to leave portions where the storage node contact holes ("contact hole formation region") are to be formed, thereby covering the contact hole formation region with the oxide layer patterns. The other portion of the region is covered with the mask layer, and then the oxide layer patterns are selectively removed with respect to the mask layer, thereby forming the storage node contact holes aligned with the bit lines without needing to perform a photolithography process. Compared to the prior art, in which the bit lines are formed and then the storage node contact holes are formed using the photolithography process, the present invention allows a greater misalignment margin. Accordingly, a semiconductor fabricating process can be performed without a short circuit occurring between the storage node contact plugs and the bit lines. Also, the sizes of the openings of the storage node contact holes are greater than those of the prior art, thereby improving contact resistance.

Although the present invention has been described with reference to the bit lines and the storage node contact holes of a DRAM, the present invention is not limited to this specific embodiment. On the contrary, the present invention can be applied to a structure which includes certain interconnections and contact holes that pass beside the interconnections. For example, a lower dielectric layer and an upper dielectric layer are sequentially stacked on a substrate. Then, the upper dielectric layer is etched to form dielectric layer patterns for molding to form parallel damascene interconnections. In this case, each of the dielectric layer patterns is formed to have a first width. Next, the lower dielectric layer between the dielectric layer patterns is partially etched, thus forming the first contact holes. Also, upper parts of the sidewalls of the dielectric layer patterns on both sides of the first contact holes are etched. A conductive material is then deposited to fill the first contact holes and spaces between the dielectric layer patterns, and then the conductive material is recessed from the dielectric layer patterns to form interconnections. An etch-back process is performed on the resultant structure in which the conductive material is deposited so that only the portions of the dielectric layer patterns having the first width protrude above the interconnections. As such, the dielectric layer patterns have also portions corresponding to a second width narrower than the first width. The first contact plugs are formed by filling the first contact holes with the conductive material, and lower parts of spaces between the dielectric layer patterns are filled with the conductive material, thereby forming the damascene interconnections. The dielectric layer patterns protruding above the interconnections are etched so that only the portions if the dielectric layer patterns having the first width protrude above the interconnections. Subsequently, the interconnections are covered with the mask layer formed of a material having an etch selectivity with respect to the upper dielectric layer and the lower dielectric layer. The mask layer is planarized using an etch-back or a CMP process until the top surfaces of the remaining dielectric layer patterns are exposed. The remaining dielectric layer patterns and the lower dielectric layer under the remaining dielectric layer patterns are selectively removed with respect to the mask layer, thereby forming the second contact holes aligned with the interconnections where the remaining dielectric layer patterns are placed. Second contact plugs are formed by filling the second contact holes with a conductive material.

According to the above method, the second contact holes can be formed without performing a photolithography process, and thus the second contact holes can be precisely aligned at proper locations and formed without having to consider a process margin.

According to the present invention, contact holes can be formed without performing separate photolithography processes. If unnecessary contacts are inadvertently formed in core and peripheral regions because of the methods of the present invention, only a cell region needs to be separately formed. However, in a DRAM fabricating process, in general, a cell region and core and peripheral regions are concurrently formed. Accordingly, if the present invention is concurrently applied to the cell region and the core and peripheral regions, an undesired contact may be formed in the core and peripheral regions. In this case, a method for adding an etch stopper for protecting the core and peripheral regions may be used.

With embodiments of the present invention, contact holes or storage node contact holes are formed using the process to form the damascene interconnections or damascene bit lines, not requiring a separate photolithographic process to form contacts, a greater misalignment margin can be obtained. Thus, the size of the contact can be increased, which in turn improves contact resistance.

If patterns of a lower layer are etched without performing a photolithography process, the contact holes or storage node contact holes can be formed without having to consider a misalignment margin between the contact holes and the interconnections or between the storage node contact holes and the bit lines. Accordingly, the semiconductor fabricating process can be performed without a short circuit occurring between contact plugs and interconnections and a short circuit occurring between storage node contact plugs and bit lines.

Since the semiconductor fabricating process is simplified and it is unnecessary to consider the misalignment margin, design rules can be greatly reduced, thereby improving the high integration of a semiconductor device. A sufficient contact margin can be obtained, thereby avoiding the complexity of a photolithography process and improving the yield of a semiconductor device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a semiconductor device, the method comprising:
    (a) forming gate stacks comprising a gate dielectric layer, a gate conductive layer, a capping layer, and a gate spacer, and source and drain regions on a semiconductor substrate;

(b) covering a first oxide layer filling spaces between the gate stacks and planarizing the first oxide layer;

(c) forming first cell pads connected to the source regions and second cell pads connected to the drain regions in the first oxide layer;

(d) forming a second oxide layer on the first oxide layer and the first and second cell pads;

(e) sequentially stacking an etch stopper and a third oxide layer on the second oxide layer;

(f) forming oxide layer patterns to form damascene bit lines parallel to each other on the second oxide layer by etching the third oxide layer so that each of the oxide layer patterns has a first width;

(g) forming bit line contact holes through which the top surfaces of the second cell pads are exposed, by partially etching the etch stopper between the oxide layer patterns and the second oxide layer, and concurrently, etching upper parts of sidewalls of the oxide layer patterns on both sides of the bit line contact holes so that the oxide layer patterns have portions having a second width narrower than the first width;

(h) forming bit line contact plugs by filling the bit line contact holes with a first conductive material, forming damascene bit lines on the bit line contact plugs by filling lower parts of spaces between the oxide layer patterns with the first conductive material, and etching the oxide layer patterns over the bit lines so that only the portions of the oxide layer patterns having the first width protrude above the bit lines;

(i) covering the bit lines with a mask layer and planarizing the mask layer until the top surfaces of the oxide layer patterns remaining after (h) are exposed;

(j) selectively removing the remaining oxide layer patterns, the etch stopper under the remaining oxide layer patterns, and the second oxide layer with respect to the mask layer, thereby forming storage node contact holes; and (k) forming storage node contact plugs by filling the storage node contact holes with a second conductive material.

2. The method of claim 1, wherein (h) comprises:

depositing the first conductive material to fill the bit line contact holes and spaces between the oxide layer patterns; and forming the bit lines by recessing the first conductive material from the oxide layer patterns, and concurrently performing an etch-back process on the resultant structure on which the first conductive material is deposited so that only the portions of the oxide layer patterns having the first width protrude above the bit lines.

3. The method of claim 1, wherein (h) comprises:

depositing the first conductive material to fill the bit line contact holes and spaces between the oxide layer patterns;

forming the bit lines by recessing the first conductive material from the oxide layer patterns, and concurrently performing an etch-back process on the resultant structure on which the first conductive material is deposited so that the overall width of the oxide layer patterns protruding above the bit lines is reduced; and etching the oxide layer patterns having a reduced width so that only the portions of the oxide layer patterns having the first width protrude above the bit lines.

4. The method of claim 3, wherein etching the oxide layer patterns having a reduced width is performed using dry etching, wet etching, or plasma etching.

5. The method of claim 1, wherein the mask layer is formed of a material having an etch selectivity with respect to those of the third oxide layer and the second oxide layer.

6. The method of claim 5, wherein the mask layer is formed of a nitride layer or an oxynitride layer.

7. The method of claim 1, wherein planarizing the mask layer is performed using an etch-back or a chemical mechanical polishing (CMP) process.

8. The method of claim 1, wherein the thickness of the third oxide layer is about 500 to about 6000 Å.

9. The method of claim 1, wherein the thickness of the etch stopper is about 10 to about 500 Å.

* * * * *